(12) United States Patent
Diekmann et al.

(10) Patent No.: US 8,791,633 B2
(45) Date of Patent: Jul. 29, 2014

(54) RADIATION-EMITTING DEVICE

(75) Inventors: Karsten Diekmann, Rattenberg (DE); Markus Klein, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1307 days.

(21) Appl. No.: 12/240,248

(22) Filed: Sep. 29, 2008

(65) Prior Publication Data

US 2009/0096362 A1    Apr. 16, 2009

(30) Foreign Application Priority Data

Sep. 27, 2007 (DE) .......... 10 2007 046 336
Dec. 20, 2007 (DE) .......... 10 2007 061 473

(51) Int. Cl.
*H05B 33/04* (2006.01)

(52) U.S. Cl.
USPC .................... 313/512; 313/504

(58) Field of Classification Search
CPC ........... F21Y 2105/006; F21Y 2105/008; F21V 21/30; F21S 2/005; F21S 6/004
USPC ................. 313/505, 511, 512
See application file for complete search history.

(56) References Cited

U.S. PATENT DOCUMENTS

| | | | |
|---|---|---|---|
| 4,433,886 A * | 2/1984 | Cassarly et al. ........... | 439/65 |
| 5,399,982 A | 3/1995 | Driller et al. | |
| 6,515,417 B1 | 2/2003 | Duggal et al. | |
| 7,063,994 B2 | 6/2006 | Xiao et al. | |
| 7,101,729 B2 | 9/2006 | Kimura et al. | |
| 2003/0035917 A1 * | 2/2003 | Hyman ................... | 428/67 |
| 2004/0021425 A1 | 2/2004 | Foust et al. | |
| 2004/0238833 A1 * | 12/2004 | Nakata ................... | 257/88 |
| 2005/0111211 A1 | 5/2005 | Takeuchi | |
| 2005/0248935 A1 * | 11/2005 | Strip et al. ............. | 362/145 |
| 2006/0017059 A1 | 1/2006 | Strip et al. | |
| 2006/0038745 A1 | 2/2006 | Naksen et al. | |
| 2007/0268699 A1 * | 11/2007 | Awabayashi ........... | 362/250 |
| 2008/0010877 A1 | 1/2008 | Deflin et al. | |
| 2008/0198585 A1 * | 8/2008 | Tait ..................... | 362/156 |

FOREIGN PATENT DOCUMENTS

| | | |
|---|---|---|
| DE | 103 24 787 | 2/2004 |
| DE | 10 2006 060 781 | 4/2008 |
| EP | 0 639 042 | 6/1994 |
| EP | 1 534 049 | 5/2005 |
| EP | 1 855 149 | 3/2007 |
| JP | 52-014989 | 2/1977 |
| JP | 2000-357585 | 12/2000 |
| JP | 2005-183352 | 7/2005 |
| JP | 2006-024834 | 1/2006 |
| JP | 2006-064911 | 3/2006 |

(Continued)

*Primary Examiner* — Andrew Coughlin
(74) *Attorney, Agent, or Firm* — Cozen O'Connor

(57) ABSTRACT

A radiation-emitting device (100) has a first and at least a second radiation-emitting organic component (10) comprising in each case a substrate (18) having a first main area, to which a first electrode is applied, comprising in each case an organic layer sequence arranged on the first electrode, wherein the organic layer sequence has at least one organic layer suitable for generating radiation, comprising in each case a second electrode arranged on the organic layer sequence, and comprising in each case an encapsulation (17) arranged on the substrate (18) above the organic layer sequence and the second electrode, wherein the first radiation-emitting organic component (10) is electrically and mechanically connected to the at least second radiation-emitting organic component (10).

12 Claims, 6 Drawing Sheets

(56) References Cited

FOREIGN PATENT DOCUMENTS

| JP | 2006-524834 | 11/2006 |
| JP | 2007-536708 | 12/2007 |
| WO | WO 99/48124 | 9/1999 |
| WO | WO 02/061558 | 8/2002 |
| WO | WO 2004/100096 | 11/2004 |
| WO | WO 2005/077096 | 8/2005 |
| WO | WO 2005/101542 | 10/2005 |
| WO | WO 2005/107411 | 11/2005 |
| WO | WO 2008/040323 | 4/2008 |

* cited by examiner

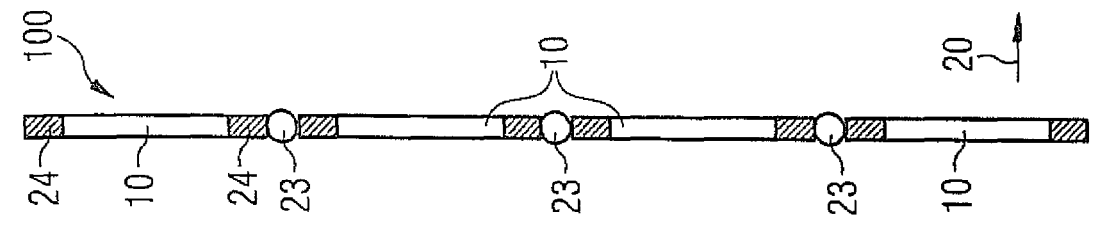
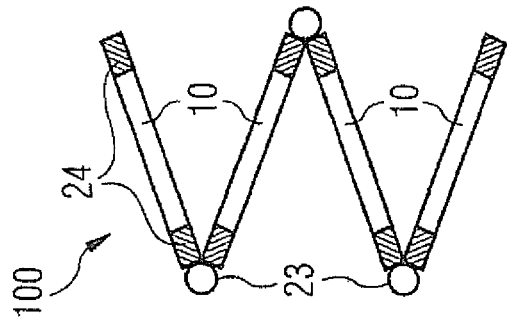
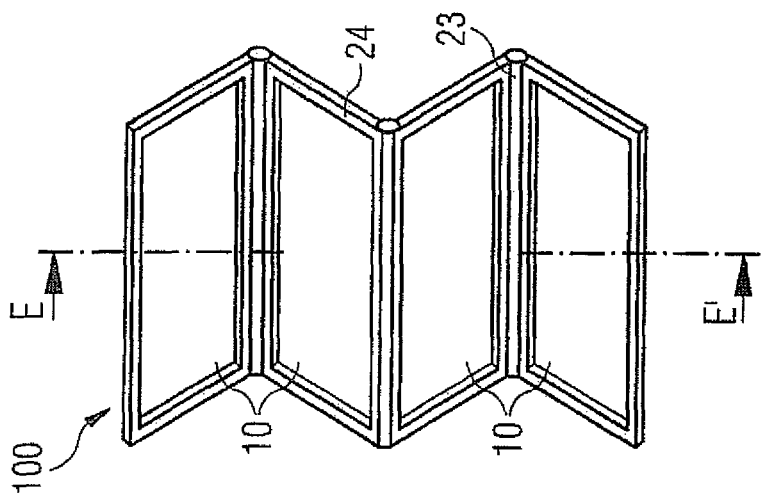

RADIATION-EMITTING DEVICE

RELATED APPLICATIONS

This patent application claims the priorities of German patent application 10 2007 046 336.9 filed Sep. 27, 2007 and of German patent application 10 2007 061 473.1 filed Dec. 20, 2007, the disclosure contents of both of which are hereby incorporated by reference.

FIELD OF THE INVENTION

The invention relates to a radiation-emitting device.

BACKGROUND OF THE INVENTION

In the field of radiation-emitting organic components there are currently restrictions with regard to the maximum producible size of an individual radiation-emitting organic component. These restrictions are caused for example by the design of the machines available for production, or by the problem of generating a constant current density required for the operation of a large-area radiation-emitting organic component.

SUMMARY OF THE INVENTION

One object of the present invention is to enable realizing a large-area radiation-emitting device.

One embodiment of the invention is a radiation-emitting device having a first and at least a second radiation-emitting organic component, wherein the first radiation-emitting organic component is electrically and mechanically connected to the at least second radiation-emitting organic component. A radiation-emitting organic component comprises in each case a substrate having a first main area, to which a first electrode is applied, an organic layer sequence respectively arranged thereon, a second electrode respectively arranged thereon, and an encapsulation arranged on the respective substrate above the respective organic layer sequence and the respective second electrode. The respective organic layer sequence has at least one organic layer suitable for generating radiation.

Thereby, the organic layer sequence can be embodied as an organic radiation-emitting diode (OLED). The organic layer sequence or the OLED can have a substrate, for example, wherein the first electrode can be arranged on the substrate. Since the first electrode is embodied in reflective fashion and the second electrode in transparent fashion, this can mean that the primary radiation can be emitted in a direction away from the substrate ("top emitter"). As an alternative, the second electrode can be arranged directly on the substrate, such that the primary radiation can be emitted through the substrate ("bottom emitter"). As an alternative, both the first and the second electrode can be transparent to the emitted primary radiation ("top and bottom emitter"). A functional region having one or a plurality of functional layers having organic materials can be applied above the first electrode. Thereby, the functional layers can have for example one or a plurality of electron injection layers (EIL), electron transport layers (ETL), hole blocking layers (HBL), electroluminescent layers (EL), electron blocking layers (EBL), hole transport layers (HTL) and/or hole injection layers (HIL). The recombination of electrons and holes leads to the electroluminescence. Individual layers can also have functionalities of a plurality of the aforementioned layers. Thus, a layer can serve for example as HIL and as HTL or as EIL and as ETL. The active region can for example be formed by an EL or comprise an EL. Furthermore, the active region can for example also be formed in the region of an interface of two layers, for instance at the interface between an ETL and an HTL.

By way of example, the substrate can comprise glass, quartz, plastic films, metal, metal films, silicon wafers or any other suitable substrate material. If the organic layer sequence or the OLED is embodied as a so-called "bottom emitter", that is to say that the primary radiation generated in the active region is emitted through the substrate, then the substrate can be transparent to at least part of the primary radiation.

The first electrode can be embodied as a cathode and thus serve as electron injecting material. Inter alia in particular aluminum, barium, indium, silver, gold, magnesium, calcium or lithium and compounds, combinations and alloys thereof can prove to be advantageous as cathode material.

The transparent second electrode, which can be embodied as an anode and can thus serve as hole injecting material, can for example comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds such as $ZnO$, $SnO_2$ or $In_2O_3$, for example, the group of the TCOs also includes ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, it can be possible that the TCOs do not necessarily correspond to a stoichiometric composition and can also be p- or n-doped. As an alternative or in addition, the second electrode can also comprise a metal, for example as mentioned in connection with the first electrode. By way of example, the second electrode can comprise a metal layer that is at least partly transparent to the primary radiation. Furthermore, the second electrode can also comprise an organic electrically conductive material.

The functional layers can comprise organic polymers, organic oligomers, organic monomers, organic small, non-polymeric molecules ("small molecules") or combinations thereof. Depending on the materials in the functional layers, the first radiation generated can have individual wavelengths or ranges or combinations thereof from the ultraviolet to infrared spectral range.

Furthermore, the organic layer sequence can have an encapsulation in order to achieve protection against moisture and/or oxidizing substances such as oxygen, for instance, for the electrodes and the functional region. In this case, the encapsulation can surround the entire organic layer sequence including the substrate. As an alternative, the substrate can form a part of the encapsulation. In this case, the encapsulation can comprise one or a plurality of layers, wherein the layers of the encapsulation can be for example planarization layers, barrier layers, water and/or oxygen absorbing layers, connecting layers or combinations thereof. Furthermore, the encapsulation can be formed in transparent fashion, in particular in the case of an organic layer sequence formed as a "top emitter".

The connection of at least two radiation-emitting organic components advantageously represents a modular concept which can be used to realize radiation-emitting devices of any desired size.

In a further embodiment, in the case of the radiation-emitting device, an electrical contact of the first radiation-emitting organic component is connected to a first electrical contact of the at least second radiation-emitting organic component in a serial or parallel manner. A second electrical contact of the at least second radiation-emitting organic component is connected to a power source.

In a further embodiment, the connection between the first and the at least second radiation-emitting organic component of the radiation-emitting device is formed as a flexible contact bridge. In this case, the contact bridge is embodied such that it is more flexible than the respective substrate of the first and of the at least second radiation-emitting organic component.

Advantageously, radiation-emitting devices which have curved forms and/or are movable in all three spatial dimensions can thus be realized despite the use of rigid radiation-emitting organic components.

In one development, the flexible contact bridge of the radiation-emitting device is embodied as a flexible film.

In a further embodiment, the flexible contact bridge of the radiation-emitting device is embodied as a printed circuit board.

In a further embodiment, the flexible contact bridge is embodied as a clampable, metallically bridged double pin.

In a further embodiment, the radiation-emitting device has a deformable sheathing enclosing the first and the at least second radiation-emitting organic component connected thereto.

In a further embodiment, the deformable sheathing comprises a plastic that is transparent to the radiation emitted by the radiation-emitting organic components. Said plastic is embodied for example as a silicone-filled transparent film.

It is thereby possible to realize arbitrary deformable radiation-emitting devices, for example illuminations.

In a further embodiment, the deformable sheathing comprises Plexiglas.

It is thereby possible to produce stable radiation-emitting devices, for example illuminations, of different forms.

In a further embodiment, a radiation-emitting device comprises a carrying frame, in which the first and the at least second radiation-emitting organic component of the radiation-emitting device are arranged and mechanically connected to one another. In this case, the electrical contact-connection of the radiation-emitting organic components can be effected via spring contacts, cables and/or clips. In this case, the material of the carrying frame can be embodied in rigid or flexible fashion.

In a further embodiment, the radiation-emitting organic components of the radiation-emitting device are additionally electrically connected to one another via the carrying frame.

In a further embodiment, the carrying frame of the radiation-emitting device is embodied as a flexible carrier grid with web structures running transversely with respect to one another. The radiation-emitting organic components are arranged in the interspaces of the flexible carrier grid. In this case, the material of the flexible carrier grid is embodied such that it is more flexible than the respective substrates of the radiation-emitting organic components arranged in the carrier grid.

Radiation-emitting devices which have curved forms and/or are movable in all three spatial dimensions can thus be realized despite the use of rigid radiation-emitting organic components.

In a further embodiment, an illumination device comprises a multiplicity of radiation-emitting organic components, wherein the latter are arranged in matrixlike fashion in the flexible carrier grid and are electrically connected to one another in parallel, in series or in a combination of in parallel and in series via said grid.

In a further embodiment, the illumination device has a flexible cover fixed on the multiplicity of radiation-emitting organic components and the flexible carrier grid. In this case, the material of the flexible cover has a flexibility equal in magnitude to that of the material of the flexible carrier grid.

In a further embodiment, the cover of the illumination device has webs arranged above the grid lines of the flexible carrier grid. Said webs are therefore embodied in accordance with the non-luminous regions of the illumination device.

It is thereby possible to realize illumination devices of any desired size which are deformable in all three spatial dimensions.

In a further embodiment, a radiation-emitting device comprises a multiplicity of radiation-emitting organic components, wherein the radiation-emitting organic components are arranged in the carrying frame in such a way that a respective radiation-emitting organic component is embedded into a frame segment equipped with articulated joints, for example four articulated joints. The frame segments are connected via the articulated joints and can be folded relative to one another in such a way that the frame in its entirety forms an accordion framework. In the folded state, therefore, a radiation-emitting organic component is situated on its adjacent radiation-emitting organic component. In this case, the radiation-emitting organic components have protection against wear as a result of contact and insulation. In the spread-out state of the radiation-emitting device, the radiation-emitting organic components form a plane area.

It is thus possible to realize foldable radiation-emitting devices of any desired size.

In a further embodiment of the accordion-shaped radiation-emitting device, the electrical contact between the individual radiation-emitting organic components is effected via electrically conductive regions of the frame. A direct electrical contact between the individual radiation-emitting organic components is thus unnecessary.

In a further embodiment, in the case of a radiation-emitting device, the carrying frame is embodied as textile material. In this case, the first and the at least second radiation-emitting electronic component are incorporated into the textile frame formed by the textile material.

It is thereby possible to produce large-area radiation-emitting products which can be suspended like a curtain or a ceiling with protuberances or can be spread over corresponding shaped bodies.

In a further embodiment, a self-supporting, radiation-emitting structural material has at least one radiation-emitting device, wherein the self-supporting, radiation-emitting structural material can be used for example as lighting in a suspended ceiling, as a wall luminar or as step-on lighting.

It is thereby possible to use the structural material as a supporting, luminous element of an architectural construction.

In a further configuration of a radiation-emitting device, the first and the at least second radiation-emitting organic component each have a contact region containing an electrically conductive material outside the encapsulations, which material makes electrical contact with the first and second electrodes situated below the encapsulations, wherein the first and the at least second radiation-emitting organic component are arranged with respect to one another in such a way that their contact regions overlap. The overlapping contact regions are electrically connected via a conductive connection. A contact region can be formed as a substrate contact region on the part of the substrate or as an encapsulation contact region on the part of the encapsulation. In this case, the conductive connection can comprise an electrically conductive adhesive. As an alternative to this, the conductive connection can for example also comprise a solder. As an alternative, the conductive connection comprises an electrically anisotropically conductive adhesive ("anisotropic conductive film", ACF).

It is thereby possible to improve the ratio of the luminous area to the total area of the radiation-emitting device.

In a further embodiment of the radiation-emitting device, in the case of the first radiation-emitting organic component, the substrate projects beyond the encapsulation, such that a substrate contact region projecting beyond the encapsulation is formed on the substrate. In the case of the at least second radiation-emitting organic component, the encapsulation projects beyond the substrate, such that an encapsulation contact region projecting beyond the substrate is formed on the encapsulation. The first and the at least second radiation-emitting organic component are arranged with respect to one another in such a way that the substrate contact region of the first radiation-emitting organic component and the encapsulation region of the at least second radiation-emitting organic component are arranged in overlapping fashion.

In a further embodiment of the radiation-emitting device, in the case of the first and in the case of the at least second radiation-emitting organic component, the substrate in each case projects beyond the encapsulation, wherein a substrate contact region is formed in each case. The first and the at least second radiation-emitting organic component are arranged with respect to one another in such a way that the substrate contact region of the at least second radiation-emitting organic component is arranged in overlapping fashion on the substrate contact region of the first radiation-emitting organic component.

In a further embodiment of the radiation-emitting device, in the case of the first and in the case of the at least second radiation-emitting organic component, the substrate is in each case displaced relative to the encapsulation in such a way that, in each case on one side of the radiation-emitting organic component, the encapsulation projects beyond the substrate and an encapsulation contact region is formed and, in each case on an opposite side of the radiation-emitting organic component, the substrate projects beyond the encapsulation and a substrate contact region is formed. The radiation-emitting organic components are arranged with respect to one another in such a way that the substrate contact region of the first radiation-emitting organic component and the encapsulation region of the at least second radiation-emitting organic component are arranged in overlapping fashion.

In a further embodiment of the radiation-emitting device, in the case of the first and in the case of the at least second radiation-emitting component, the substrate projects beyond the encapsulation, such that the first and the at least second radiation-emitting organic component in each case form substrate contact regions. The first and the at least second radiation-emitting organic component are arranged spatially adjacent to one another, such that the respective substrate contact regions adjoin one another in the form of a butt contact-connection. The respective substrate contact regions are electrically connected to one another via a conductive connection.

Further advantages and advantageous embodiments and developments of the invention will become apparent from the embodiments described below in conjunction with FIGS. 1 to 4D.

In the exemplary embodiments and figures, identical or identically acting constituent parts may be provided in each case with the same reference symbols. The elements illustrated and their size relationships among one another should not in principle be regarded as true to scale; rather, individual elements, such as, for example, layers, structural parts, components and regions, may be illustrated with exaggerated thickness or size dimensions for the sake of better representability and/or for the sake of better understanding.

BRIEF DESCRIPTION OF THE DRAWINGS

FIG. 3A shows a schematic illustration of an embodiment of a radiation-emitting device according to a further embodiment of the invention, FIG. 3B shows a schematic illustration of a sectional view of the radiation-emitting device from FIG. 3A, FIG. 3C shows a schematic illustration of FIG. 3B in the spread-out state, FIGS. 4A to 4C each show a schematic illustration of an embodiment of a radiation-emitting device with overlapping contact regions.

DETAILED DESCRIPTION OF THE DRAWINGS

Figure 1:
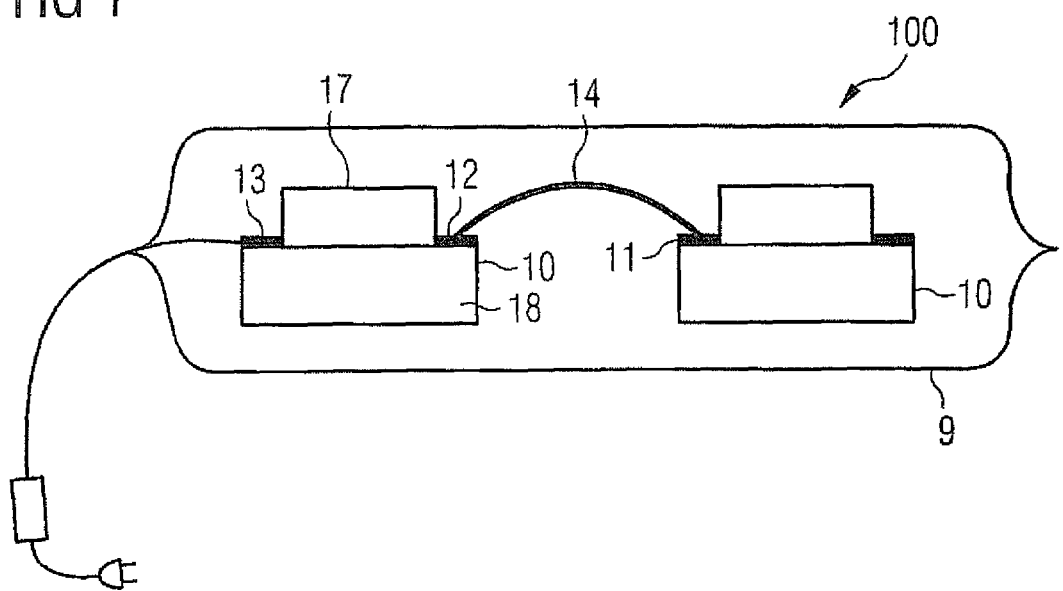
FIG. 1 shows a schematic illustration of a radiation-emitting device according to one embodiment of the invention.

FIG. 1 shows a schematic illustration of a radiation-emitting device 100 according to one embodiment of the invention. The radiation-emitting device 100 has two radiation-emitting organic components 10. Each radiation-emitting organic component 10 comprises a substrate 18 having a first electrode, an organic layer sequence and a second electrode, and also an encapsulation 17. For each radiation-emitting organic component 10, two electrical contacts are formed on the surface of the substrate 18. An electrical contact 11 of the right-hand radiation-emitting organic component 10 is connected to an electrical contact 12 of the left-hand radiation-emitting organic component 10 via an electrically conductive connection 14. An electrical contact 13 of the left-hand radiation-emitting organic component 10 is connected to an external voltage supply. The electrically conductive connection 14 is formed as a flexible contact bridge. Furthermore, the radiation-emitting device 100 has a sheathing 9. The sheathing 9 encloses the two radiation-emitting organic components 10 connected to one another. In this case, the sheathing comprises a plastic that is transparent to the radiation of the two radiation-emitting organic components 10, for example a silicone-filled transparent film.

The illustrated radiation-emitting device 100 realizes an area that is a factor of 2 larger than the present-day maximum producible size of radiation-emitting organic components. The shown modular concept can be extended as desired. It is thus possible, therefore, to produce radiation-emitting devices, for example illuminations, of any desired size.

Furthermore, the shown radiation-emitting device 100 is movable in all three spatial dimensions. Owing to the use of the flexible contact bridge 14, flexible radiation-emitting devices 100 can be realized even with the use of rigid organic radiation-emitting components 10. Given an appropriate choice of the material for the sheathing 9, the radiation-emitting organic components 10 can be folded by up to 180 degrees relative to one another.

Figure 2A:
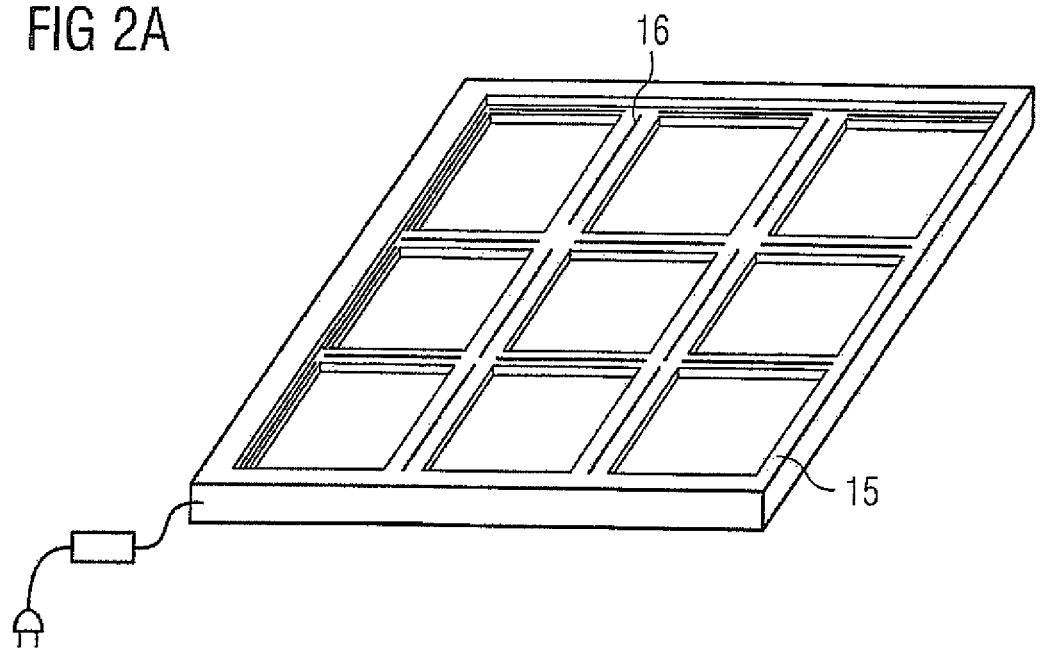
FIG. 2A shows a schematic illustration of a carrying frame according to a further embodiment of the invention.

FIG. 2A shows a schematic illustration of a carrying frame according to a further embodiment of the invention. Arranged within a quadrangular carrying frame 15 are web structures which run transversely with respect to one another and which delimit a partial region of the grid formed in this way from the respective adjacent partial region. Three partial regions are present in each case both in the vertical direction and in the horizontal direction, thus resulting in a total of 9 partial regions. In this case, each partial region is designed in terms of its size in such a way that it is suitable for receiving a radiation-emitting organic component 10. Each edge enclosing a partial region of the grid has a conductive region 16 at all sides. The conductive regions 16 serve for making electrical contact with the radiation-emitting organic components 10 to be inserted into the carrying frame 15. The power supply is effected by means of an external voltage supply that can be connected via a plug.

In this case, the material for the carrying frame 15 can be chosen to be flexible, such that said frame is pliable in all three spatial dimensions.

The conductive regions 16 can also be embodied at in each case two opposite sides of a partial region of the grid or at one side of a partial region of the grid. The last-mentioned embodiment involves a conductive region which is divided into two and which has two electrical contacts insulated from one another.

Figure 2B:
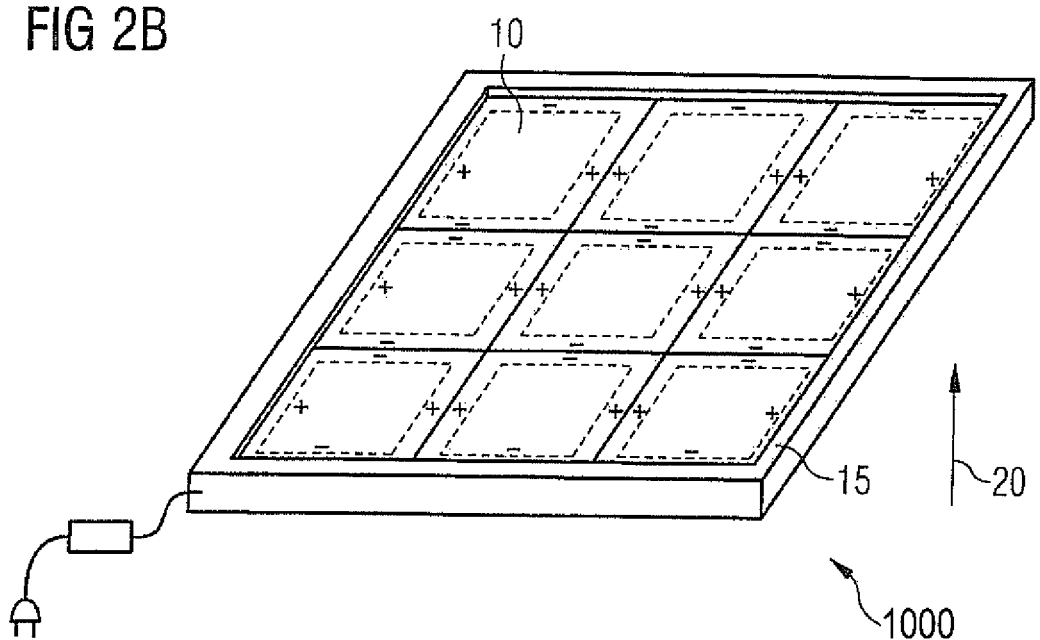
FIG. 2B shows a schematic illustration of an optionally flexible illumination device according to a further embodiment of the invention.

FIG. 2B shows a schematic illustration of an optionally flexible illumination device according to the principle described in FIG. 2A. The illustrated illumination device 1000 comprises the carrying frame 15 from FIG. 2A, and also nine radiation-emitting organic components 10. In this case, each organic radiation-emitting component 10 is inserted into a partial region of the carrying frame 15. The individual radiation-emitting organic components 10 are connected up in parallel with one another in the manner illustrated. In this case, electrical contact is made with the radiation-emitting organic components 10 via the conductive regions 16 of the carrying frame 15 that are shown in FIG. 2A.

When the illustrated plug is connected to an external voltage supply, the illustrated illumination device 1000 generates light that is emitted in an illustrated emission direction 20, that is to say upward.

The illustrated illumination device 1000 can be movable in all three spatial directions despite the use of rigid radiation-emitting organic components 10. The illumination device 1000 can be scaled as desired by correspondingly enlarging or reducing the size of the carrying frame 15 and incorporating an appropriate number of radiation-emitting organic components 10. It is thus possible, therefore, to produce large-area illumination devices.

The interconnection of the radiation-emitting organic components 10 is not restricted to the illustrated parallel type, but rather can also be realized as series interconnection or as a combination of series and parallel interconnection.

FIG. 3A shows a schematic illustration of an embodiment of a radiation-emitting device 100 according to a further embodiment of the invention. The front view of a further radiation-emitting device 100 is illustrated. The radiation-emitting device 100 comprises four radiation-emitting organic components 10. In this case, each radiation-emitting organic component 10 is inserted into a frame segment 24 enclosing the radiation-emitting organic component 10 at all four sides. The frame segments 24 with the radiation-emitting organic components 10 contained therein are mechanically interconnected in each case via a hinge 23. In this case, the hinges 23 are configured in such a way that it is possible to fold the individual frame segments 24 relative to one another, such that, in the folded-together state, a frame segment 24 is situated on its adjacent frame segment 24. In this case, the individual radiation-emitting organic components 10 are protected against mechanical wear by a correspondingly designed encapsulation. The electrical connection between the individual radiation-emitting organic components 10 is effected via conductive regions within the frame segments 24 which are connected to one another via electrical lines led in the hinges 23.

FIG. 3B shows a schematic illustration of a sectional view of the radiation-emitting device 100 from FIG. 3A along the section E-E'. The illustration shows the four radiation-emitting organic components 10, each inserted into a frame segment 24. The frame segments 24 are mechanically connected to one another via three hinges 23. The radiation-emitting device 100 is illustrated here in the half folded-together state.

FIG. 3C shows a schematic illustration of FIG. 3B in the spread-out state. In this case, the four radiation-emitting organic components 10 together with the frame segments 24 and the three hinges 23 form a plane area. Upon connection of an external voltage supply, the radiation-emitting device 100 generates light that is emitted in emission direction 20, that is to say toward the right.

The shown radiation-emitting device 100 can be folded together and can thus be transported for example more simply. The shown radiation-emitting device 100 can be extended as desired by adding further radiation-emitting organic components 10 which, inserted into further frame segments 24, are connected to the device shown via further hinges 23. It is thus possible to realize large-area radiation-emitting devices.

Figure 4A:
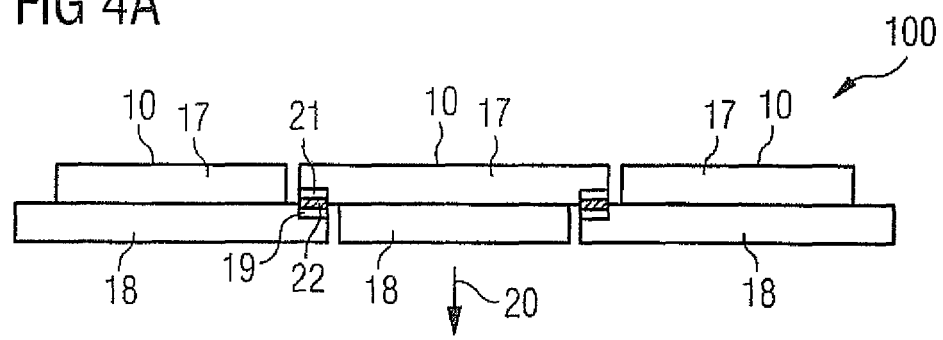
FIG. 4D shows a schematic illustration of a further embodiment of a radiation-emitting device.

FIG. 4A shows a schematic illustration of a further embodiment of a radiation-emitting device 100 with overlapping contact regions. Three radiation-emitting organic components 10 are illustrated. Contact regions are illustrated on both sides of each radiation-emitting organic component 10. A contact region comprises an electrically conductive material that is connected below the encapsulation 17 to the first or the second electrode of a radiation-emitting organic component 10, such that a dedicated contact region is formed for each electrode. In the case of the left-hand and in the case of the right-hand radiation-emitting organic component 10 as illustrated, the substrate 18 projects beyond the encapsulation 17. Consequently, a substrate contact region 19 projecting beyond the encapsulation 17 is formed on the substrate 18. In the case of the central radiation-emitting organic component 10, by contrast, the encapsulation 17 projects beyond the substrate 18. An encapsulation contact region 21 projecting beyond the substrate 18 is thus formed on the encapsulation 17. The three radiation-emitting organic components 10 are arranged in such a way that their contact regions overlap. Specifically, this means that the left-hand encapsulation contact region 21 of the central radiation-emitting electronic component 10 overlaps the substrate contact region 19 of the left-hand radiation-emitting electronic component 10. Furthermore, the right-hand encapsulation contact region 21 of the central radiation-emitting organic component 10 overlaps the substrate contact region 19 of the right-hand radiation-emitting organic component 10. Via an electrically conductive contact-connection 22, the contact regions of the radiation-emitting organic components are electrically connected and cohesively adhesively bonded to one another. By way of example, the conductive contact-connection 22 comprises a conductive paste. The emission direction 20 is downward in the case of the radiation-emitting device 100 shown.

The ratio of the luminous area to the total area of the radiation-emitting device 100 is improved with the shown arrangement, that is to say by the overlapping of the contact regions. An example of the improvement follows: in the case of an exemplary radiation-emitting organic component 10, the edge length of the square luminous area is 9 cm and the edge length of the likewise square outer glass is 10 cm. This results in a circumferential width of a non-luminous region of 0.5 cm. In this case, the width of the contact region is 0.25 cm, for example. In the case of a non-overlapping arrangement, therefore, the width of the non-luminous area between two adjacent radiation-emitting organic components 10 is precisely 1 cm. The proportion of the luminous area with respect to the total area is thus 81%. In the case of an improvement as a result of the overlapping of the contact regions, the non-luminous region between two radiation-emitting organic components 10 is reduced to 0.75 cm. The proportion of the luminous area with respect to the total area is thus increased to 85.2%. This results in a relative improvement of 5.2%.

In a second example with another, likewise square, organic radiation-emitting component 10 having an edge length of the luminous area of 4 cm and an edge length of the outer glass of 5 cm, a circumferential non-luminous region of 0.5 cm once again results. The circumferential width of the contact region is once again 0.25 cm. A 1 cm wide non-luminous region thus results in the case of an adjacent arrangement of the radiation-emitting organic components 10. The proportion of the luminous area with respect to the total area is 64% in this case. In the case of the improved arrangement, that is to say if the contact regions overlap, the non-luminous region between two radiation-emitting organic components 10 is reduced to 0.75 cm. This means that the proportion of the luminous area with respect to the total area increases to 70.9% and a relative improvement of 10.8% results.

Figure 4B:
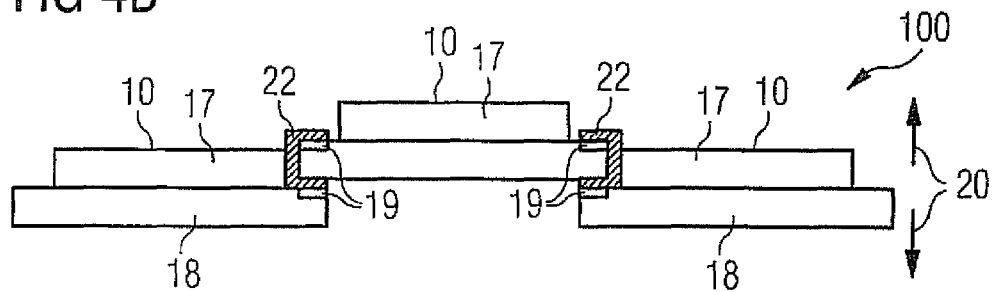

FIG. 4B shows a further embodiment of a radiation-emitting device 100 having overlapping contact regions. The illustration shows three radiation-emitting organic components 10 having in each case a substrate 18 and in each case an encapsulation 17. In this case, each radiation-emitting organic component 10 forms a substrate contact region 19 on each side. In this case, the radiation-emitting organic components 10 are arranged in such a way that the central radiation-emitting organic component 10 is arranged with the underside of the substrate above the substrate contact regions 19 respectively formed by the right-hand and left-hand radiation-emitting organic components 10. In this case, the radiation-emitting organic components 10 are electrically connected to one another via the conductive connection 22. The conductive contact-connection can in this case comprise a conductive paste or a flexible film. The radiation-emitting device 100 as shown can emit either upward or downward or in both directions, as illustrated by emission direction 20. The vertical offset of the radiation-emitting organic components 10 with respect to one another is compensated for by means of planarization layers, for example casting resin, such that the surface appearance is planar.

With this arrangement, too, the ratio of the luminous area to the total area is improved, in accordance with the examples described in FIG. 4A.

Figure 4C:
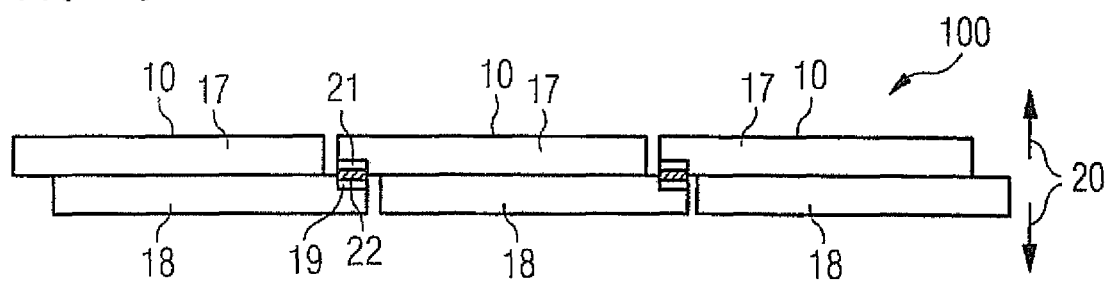

FIG. 4C shows a further embodiment of a radiation-emitting device 100 having overlapping contact regions. The illustration shows three radiation-emitting organic components 10, having in each case an encapsulation 17 and in each case a substrate 18. In the case of each radiation-emitting organic component 10, the encapsulation 17 in this case is displaced relative to the substrate 18 in such a way that an encapsulation contact region 21 is in each case formed on the left-hand side and a substrate contact region 19 is in each case formed on the right-hand side. In this case, the electrical connection between the individual radiation-emitting organic components 10 is produced via a conductive connection 22. With shown the radiation-emitting device 100, light can be emitted upward and downward in accordance with the emission direction 20 illustrated.

The ratio of the luminous area to the total area is improved by means of the overlapping of the contact regions of the radiation-emitting organic components 10. In this case, it is possible to achieve factors as in the examples described under FIG. 4A.

Figure 4D:
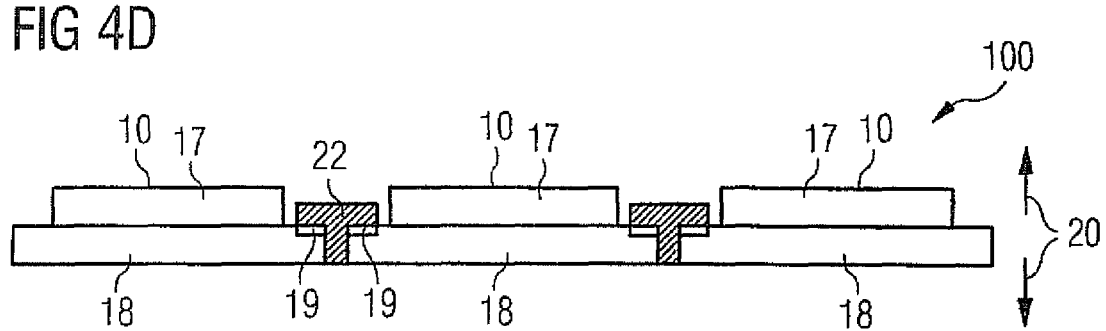

FIG. 4D shows a further embodiment of a radiation-emitting device 100. The illustration shows three radiation-emitting organic components 10 having in each case a substrate 18 and in each case an encapsulation 17. In this case, the radiation-emitting organic components 10 form a respective substrate contact region 19 in each case on their right-hand side and their left-hand side. In this case, the radiation-emitting organic components 10 are arranged adjacent to one another, such that side area is situated alongside side area in accordance with a butt contact-connection. In this case, the electrical contact-connection of the respective substrate contact regions 19 of adjacent radiation-emitting organic components 10 is realized via a conductive connection 22. In this case, the conductive connection 22 can comprise for example a conductive paste or a so-called anisotropic conductive film. Via this conductive contact-connection 22, the radiation-emitting organic components 10 are also mechanically connected to one another, for example adhesively bonded to one another. The illustration also shows the emission direction 20, which in this case points upward and downward.

Figure 5:
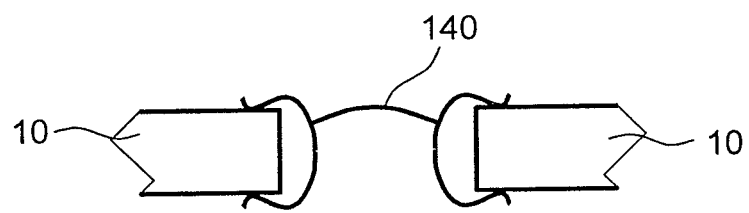
FIG. 5 shows a clampable, metallically bridged double pin.

FIG. 5 shows a clampable, metallically bridged double pin 140 connecting radiation-emitting organic devices 10.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. A radiation-emitting device having a first and at least a second radiation-emitting organic component, each of the first and the at least second radiation-emitting component comprising:
   a substrate having a first main area, to which a first electrode is applied;
   an organic layer sequence arranged on the first electrode, the organic layer sequence including at least one organic layer suitable for generating radiation;
   a second electrode arranged on the organic layer sequence; and
   an encapsulation arranged on the substrate above the organic layer sequence and the second electrode;
   wherein the first radiation-emitting organic component is electrically and mechanically connected to the at least second radiation-emitting organic component;
   wherein the connection between the first and the at least second radiation-emitting organic component is formed as a flexible contact bridge which is more flexible than a respective substrate of the first and of the at least second radiation-emitting organic component; and
   wherein the flexible contact bridge comprises a clampable, metallically bridged double pin being deformed to clamp around each of the first and the at least second radiation-emitting component.

2. The radiation-emitting device as claimed in claim 1, wherein an electrical contact of the first radiation-emitting organic component is connected serially or in parallel to a first electrical contact of the at least second radiation-emitting organic component, and wherein a second electrical contact of the at least second radiation-emitting organic component is connected to a power source.

3. The radiation-emitting device as claimed in claim 1, further comprising:
    a deformable sheathing enclosing the first and the at least second radiation-emitting organic component connected thereto.

4. The radiation-emitting device as claimed in claim 3, wherein the deformable sheathing comprises a plastic transparent to the radiation emitted by the radiation-emitting organic components.

5. The radiation-emitting device as claimed in claim 1, further comprising:
    a carrying frame, in which the first and the at least second radiation-emitting organic component are arranged and mechanically connected to one another.

6. The radiation-emitting device as claimed in claim 5, wherein the radiation-emitting organic components are electrically connected to one another via the carrying frame.

7. The radiation-emitting device as claimed in claim 5, wherein the carrying frame comprises a flexible carrier grid including web structures extending transversely with respect to one another;
    wherein a material of the flexible carrier grid which is more flexible than respective substrates of the radiation-emitting organic components; and
    wherein the radiation-emitting organic components are arranged in interspaces of the flexible carrier grid.

8. An illumination device comprising a radiation-emitting device according to claim 7, comprising:
    a multiplicity of radiation-emitting organic components;
    wherein the radiation-emitting organic components are arranged in a matrixlike manner in the flexible carrier grid and are electrically connected to one another in parallel, in series or in a combination of in parallel and in series via said flexible carrier grid.

9. The illumination device as claimed in claim 8, further comprising:
    a flexible cover fixed on the flexible carrier grid and the multiplicity of radiation-emitting organic components;
    wherein a material of the flexible cover has a flexibility equal in magnitude to that of a material of the flexible carrier grid.

10. The illumination device as claimed in claim 9, wherein the cover includes webs arranged above grid lines of the flexible carrier grid.

11. The radiation-emitting device as claimed in claim 5, wherein the carrying frame comprises textile material into which the radiation-emitting organic components are incorporated.

12. A self-supporting, radiation-emitting structural material, including the at least one radiation-emitting device as claimed in claim 1, wherein the self-supporting, radiation-emitting structural material forms step-on lighting.

* * * * *